(12) United States Patent
Hagedoorn

(10) Patent No.: US 7,518,954 B2
(45) Date of Patent: Apr. 14, 2009

(54) MOTION TRANSDUCER

(75) Inventor: Arend L. Hagedoorn, Voorschoten (NL)

(73) Assignee: Input/Output, Inc., Houston, TX (US)

( * ) Notice: Subject to any disclaimer, the term of this patent is extended or adjusted under 35 U.S.C. 154(b) by 27 days.

(21) Appl. No.: 11/756,842

(22) Filed: Jun. 1, 2007

(65) Prior Publication Data

US 2008/0001597 A1     Jan. 3, 2008

Related U.S. Application Data

(60) Provisional application No. 60/810,744, filed on Jun. 2, 2006.

(51) Int. Cl.
*G01V 1/18* (2006.01)

(52) U.S. Cl. ...................................... 367/185

(58) Field of Classification Search ............... 367/185, 367/183
See application file for complete search history.

(56) References Cited

U.S. PATENT DOCUMENTS

| | | | |
|---|---|---|---|
| 3,726,145 A | 4/1973 | Bedford et al. | |
| 3,739,330 A | 6/1973 | Hazelhurst et al. | |
| 4,003,018 A * | 1/1977 | McCormick | 367/13 |
| 4,144,520 A | 3/1979 | McNeel | |
| 4,369,506 A | 1/1983 | Benzing | |
| 4,438,292 A | 3/1984 | Woodall | |
| 4,599,713 A * | 7/1986 | Rudaz | 367/188 |
| 4,811,311 A | 3/1989 | Woodall, Jr. et al. | |
| 5,010,531 A | 4/1991 | McNeel | |
| 5,077,697 A * | 12/1991 | Chang | 367/31 |
| 5,119,345 A | 6/1992 | Woo et al. | |
| 5,469,408 A | 11/1995 | Woo | |
| 5,878,001 A | 3/1999 | McNeel et al. | |
| 6,075,754 A | 6/2000 | VanZandt et al. | |
| 6,607,050 B2 * | 8/2003 | He et al. | 367/20 |
| 6,608,408 B1 * | 8/2003 | Denne | 310/14 |
| 2008/0001597 A1 * | 1/2008 | Hagedoorn | 324/207.13 |

FOREIGN PATENT DOCUMENTS

| | | |
|---|---|---|
| EP | 0082524 A2 | 6/1983 |
| EP | 0110431 A1 | 6/1984 |
| GB | 2411723 A | 9/2005 |
| WO | WO 96/02855 | 2/1996 |

* cited by examiner

*Primary Examiner*—Dan Pihulic
(74) *Attorney, Agent, or Firm*—Wong, Cabello, Lutsch, Rutherford & Brucculeri, LLP

(57) ABSTRACT

A motion sensing transducer is disclosed that includes a case having an inner surface, a first cap that closes the case at a first end and a second cap that closes the case at a second end. The case inner surface, first cap and second cap define a space within the case. The apparatus further includes at least one inner plate member separating the space into at a first compartment and a second compartment within the case, a coil-magnet assembly that produces a signal when subjected to motion, the coil-magnet assembly disposed immediately within the case and in the first compartment, and an electronic circuit disposed within the second compartment that modifies the signal.

21 Claims, 5 Drawing Sheets

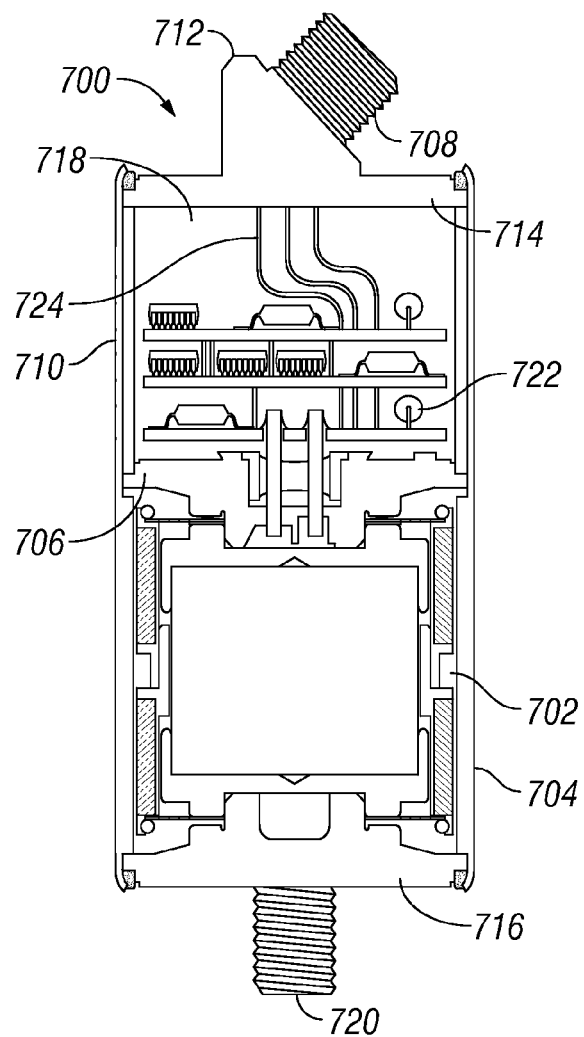
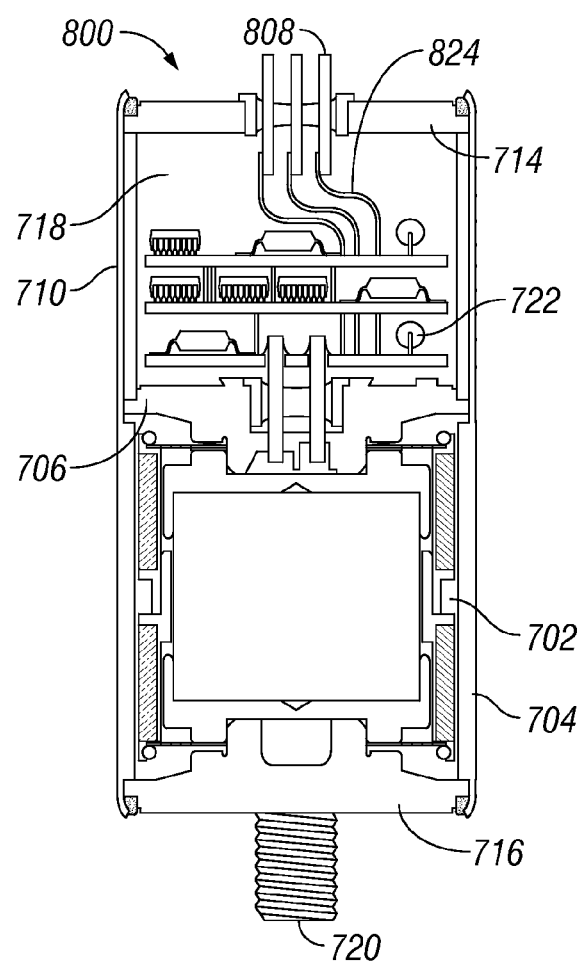
FIG. 7  FIG. 8

MOTION TRANSDUCER

CROSS-REFERENCE TO RELATED APPLICATIONS

The present application claims the benefit of U.S. Provisional Application Ser. No. 60/810,744 filed on Jun. 2, 2006 and titled "Motion Transducer" the entire disclosure of which is hereby incorporated herein by reference.

BACKGROUND OF THE DISCLOSURE

1. Technical Field

The present disclosure generally relates to transducer sensors for sensing motion.

2. Background Information

Motion transducer sensors are used in a variety of applications. As an example, geophones are motion transducers that sense motion by suspending an inertial reference mass structure from a rigid, fixed supporting structure. Typically, the mass is a coil form suspended by springs in a magnetic field, one spring being attached at each end of the coil form. The springs position the coil form within the magnetic field so that the coil form is centered laterally and along its axis within the magnetic field. The springs also form a suspension system having a predetermined resonant frequency. In the case of geophones, the media is the earth. The same general transducer configuration may be used in any number of motion sensing applications having a measured media other than the earth.

Motion transducer sensors of the coil-magnet type are also used non-seismic applications, e.g. structural measurements. A coil-magnet transducer may be fixed to a structure element using an adhesive or fasteners.

SUMMARY

The following presents a general summary of several aspects of the disclosure in order to provide a basic understanding of at least some aspects of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows.

In one non-limiting aspect, a motion transducer apparatus includes a case having an inner surface, a first cap that closes the case at a first end and a second cap that closes the case at a second end. The case inner surface, first cap and second cap define a space within the case. The apparatus further includes at least one inner plate member separating the space into at a first compartment and a second compartment within the case, a coil-magnet assembly that produces a signal when subjected to motion, the coil-magnet assembly disposed immediately within the case and in the first compartment, and an electronic circuit disposed within the second compartment that modifies the signal.

Another non-limiting aspect provides a method that includes generating a signal representative of motion using a motion transducer, the motion transducer including a case having an inner surface, a first cap that closes the case at a first end, a second cap that closes the case at a second end, the case inner surface, first cap and second cap defining a space within the case, at least one inner plate member separating the space into at a first compartment and a second compartment within the case, a coil-magnet assembly that produces the signal when subjected to motion, the coil-magnet assembly disposed immediately within the case and in the first compartment. The method further includes modifying the signal using an electronic circuit disposed within the second compartment.

BRIEF DESCRIPTION OF THE DRAWINGS

For detailed understanding of the present disclosure, references should be made to the following detailed description of the preferred embodiment, taken in conjunction with the accompanying drawings, in which like elements have been given like numerals and wherein:

FIG. 7 illustrates mounting and cable connector aspects of the disclosure;

FIG. 8 illustrates other mounting and cable connector aspects of the disclosure.

DESCRIPTION OF EXEMPLARY EMBODIMENTS

Figure 1:
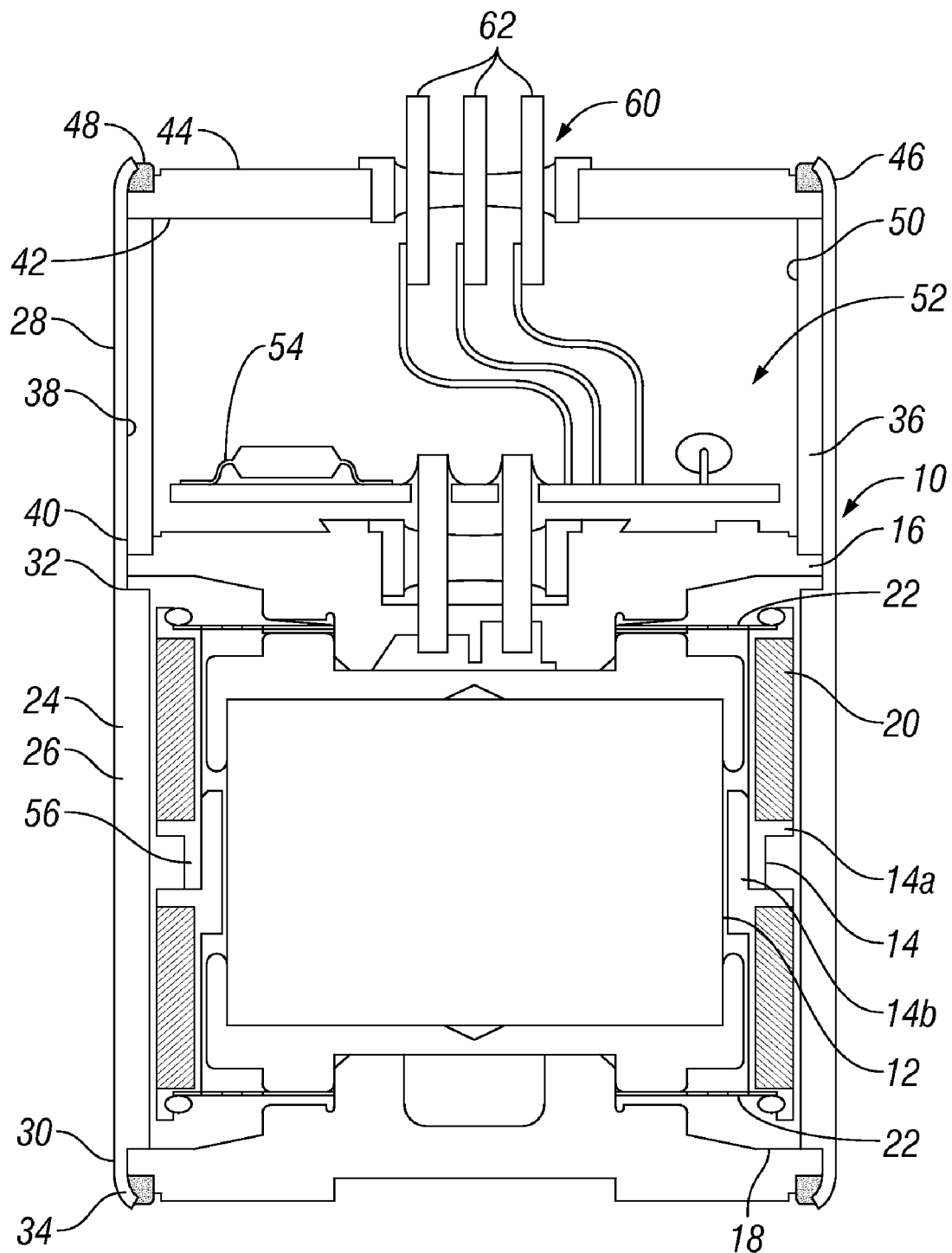
FIG. 1 illustrates a rotating coil coil-magnet motion transducer having aspects of the disclosure for providing a transducer output signal representative of sensed motion.

FIG. 1 illustrates a rotating coil coil-magnet motion transducer 10. The transducer 10 includes a magnet 12 surrounded by a coil form 14. The magnet 12 may be fixedly coupled to an inner top end plate or cap 16 and to a bottom end plate or cap 18. The coil form 14 may include a two-piece configuration having an upper coil form 14a and a lower coil form 14b as shown or may be of a one piece construction. The coil form further includes an electrically-conductive coil winding 20. The coil form is coupled to the magnet 12, inner top end plate 16 and bottom end plate 18 by a pair of springs 22 to allow relative movement of the coil form and magnet. The coil form 14 and magnet 12 may be considered for the purposes of this disclosure as forming at least a portion of a coil-magnet assembly 56.

The coil-magnet assembly 56 is disposed immediately within a cylindrical steel outer case 24. The case 24 includes a thick wall section 26, an upper extended thin wall section 28 and a lower thin wall section 30. The thick wall section may have a thickness selected based on the overall size and structural requirements desired for a particular transducer, and such dimensioning is within the skill of the art. The thick wall section 26 may have a thickness of about 1.0 mm to about 14 mm. The thinner wall sections 28, 30 may be on the order of about three-quarters down to one-quarter the thickness of the thick wall section 26 depending on particular needs and materials used. In one aspect the thin wall section is about 0.4 mm thick and the thick wall section is about 1.2 mm thick. The thicknesses and ranges provided here are not intended to limit the scope of the claims. A wall thickness or relative thickness falling outside the range specified herein is considered within the scope of the disclosure.

A first case shoulder 32 is located at a junction of the upper extended thin wall section 28 and the thick wall section 26. The inner top end plate 16 abuts the first shoulder 32. A second case shoulder 34 is located at a junction of the lower thin wall section 30 and the thick wall section 26. The bottom end plate 18 abuts the second case shoulder 34.

A cylindrical spacer 36, which may be a metal or non-metal, is disposed on an inner surface 38 of the case extended thin wall section and extends from a top or outer surface 40 of the inner top end plate to a bottom or inner surface 42 of an outer top end plate or cap 44. A distal upper end 46 of the case extended thin wall section may be crimped over the outer top end plate 44 and sealed via an elastomer seal 48 to close the upper portion of the transducer 10.

The bottom surface 42 of the outer top end plate 44, and inner surface 50 of the cylindrical spacer and the top surface 40 of the inner top end plate form a compartment 52 within the transducer 10. Embodiments having stacked circuits, multiple top compartments and embodiments with top and bottom compartments will be described later with respect to FIGS. 2-4.

Still referring to FIG. 1, one or more electronic circuits 54 may be housed within the compartment 52. The electronic circuits may be mounted on a circuit board as shown and may include one or more of an amplifier circuit, a filter circuit, a signal conditioning circuit, a converter circuit such as an analog-to-digital circuit and or a force feedback circuit for controlling the coil-magnet assembly.

The coil form is coupled to the fixed coil-magnet assembly via the springs. When the case is coupled to a media of interest, the case and magnet will move along with movement of the media of interest. The coil form will tend to remain motionless thereby causing relative movement of the coil within the magnet magnetic field setting up an electrical current in the coils of the coil form. The electrical current is a signal produced by the coil-magnet assembly 56 that is an analog electrical signal. The electrical signal an analog signal representative of the movement of the case, and therefore the movement of the media of interest. The analog electrical signal is conducted from the coil-magnet assembly the electronic circuits 54 for filtering and conditioning and may be conducted to an analog-to-digital converter circuit to transform the analog signal to a digital signal suitable for processing by a computer or processor. The processed signals provide useful information about the sensed motion.

The case 24 may be a steel case where the steel case forms a concentrator for the magnetic flux of the magnet. A pair of electrical leads exits the coil-magnet assembly compartment at an end. The analog signal is modified by the electronic circuits and is then conveyed out of the case via a terminal pass-through 60 and electrical leads or terminals 62, which leads or terminals may be then connected to various other electronic circuits, a processor and or recorder device not shown here.

Figure 2:
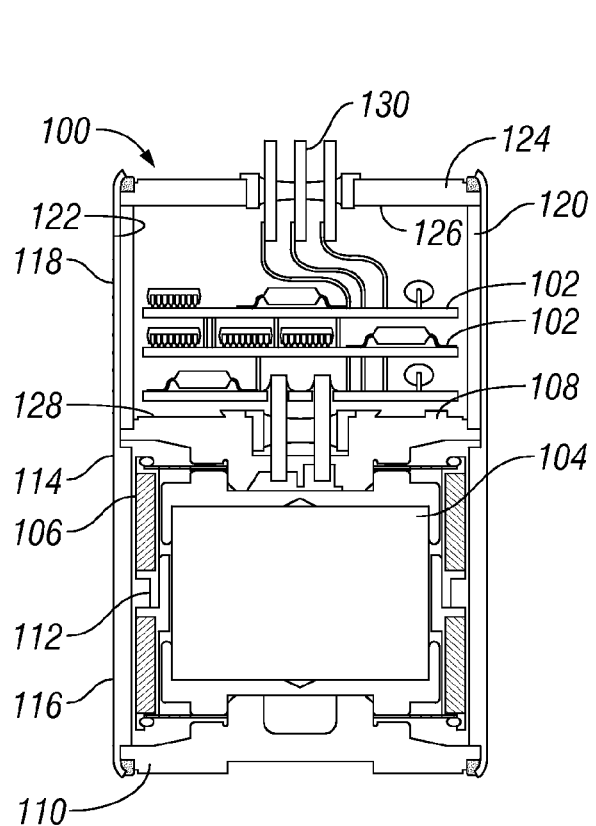
FIG. 2 illustrates aspects of the disclosure having stacked circuits within a transducer compartment for providing a transducer output signal representative of sensed motion.

Referring to FIG. 2, another aspect of a motion transducer 100 includes several circuits in a stacked configuration within a transducer compartment for providing a modified signal and a transducer output signal. FIG. 2 shows stacked circuits 102 oriented substantially perpendicular to a longitudinal axis of the transducer 100.

In one aspect, the transducer 100 includes a magnet 104 surrounded by a coil form 106. The magnet 104 may be fixedly coupled to an inner top end plate or cap 108 and to a bottom end plate or cap 110. The coil form and magnet may be considered a coil-magnet assembly 112, which may be substantially similar to the coil-magnet assembly described above and shown in FIG. 1.

The coil magnet assembly 112 is disposed immediately within a case 114. In one aspect, the case 114 comprises a cylindrical steel outer case. The case 114 includes a thick wall section 116, an upper extended thin wall section 118 substantially similar to the wall sections described above and shown in FIG. 1.

A top cap 124 is used to close an end section of the transducer. The top cap 124 has an inner surface 126, the extended wall section 118 has an inner surface 122, and the coil-magnet assembly cap 108 has an outer surface 128. These surfaces form or define a compartment within the transducer case 114 to house the electronic circuits 102.

A cylindrical spacer 120, which may be a metal or non-metal, may be disposed in the compartment and extend along the surface 122 of the case extended thin wall section from the coil-magnet assembly cap 108 to the top cap 124 to provide added support for the case 114 and to secure the inner cap 108. In other aspects the thin wall section may include a support structure such as a rib structure to provide support. The case may alternatively include a groove structure to secure the inner cap 108. Alternatively there may be no added spacer or structure to provide added support and the thin wall section may provide full support. Alternatively, the inner cap may be secured by an adhesive, by fasteners or may be friction fit into place. Similarly to the transducer described above and shown in FIG. 1, the case extended thin wall section may be crimped over the outer top cap 124 and sealed using an elastomer seal.

Still referring to FIG. 2, the electronic circuits 102 are mounted on printed circuit boards oriented perpendicular to a longitudinal axis of the transducer 100. The circuit boards are mounted in a stacked configuration. Any or all circuit boards 102 may include selected circuits for modifying a signal emanating from the coil-magnet assembly 112. The circuits may include one or more of an amplifier circuit, a filter circuit, a signal conditioning circuit, a converter circuit such as an analog-to-digital circuit and or a force feedback circuit for controlling the coil-magnet assembly. The signal emanating from the coil-magnet assembly is an analog signal representative of the movement of the case, and therefore the movement of the media of interest to which the case is coupled. The analog signal is modified by the electronic circuits and is then conveyed out of the case via a plurality of terminals 130, which terminals may be then connected to various other electronic circuits, a processor and or recorder device not shown here.

Figure 3:
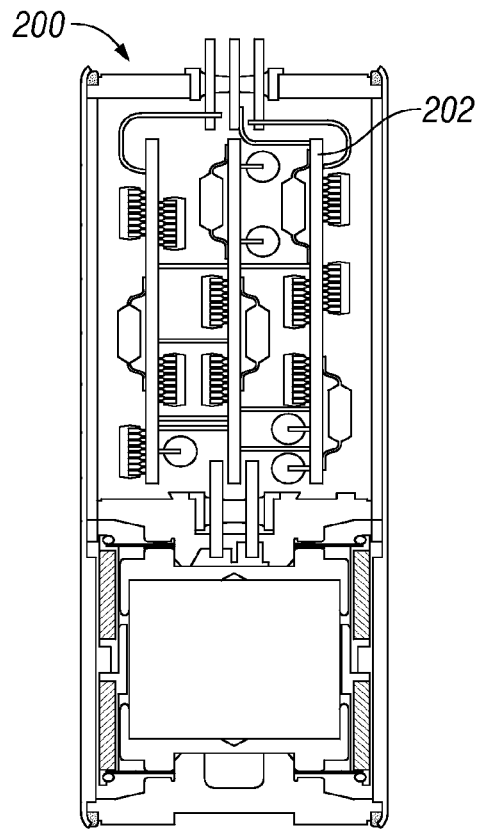
FIG. 3 illustrates aspects of the disclosure having vertically-arranged circuits within a transducer compartment for providing a transducer output signal representative of sensed motion.

Stacked circuits similar to the stacked circuits described above and shown in FIG. 2 may be oriented in a vertical configuration as shown in FIG. 3. FIG. 3 illustrates a transducer 200 having multiple circuit boards 202 configured in a vertical relationship and oriented substantially parallel to a longitudinal axis of the transducer 200 and within a case compartment. The circuit components may be mounted on the circuit boards on a single side or double side as shown. Although all transducer components are clearly shown in FIG. 3, in the interest of brevity, reference is made back to the configurations described above and shown in FIGS. 1 and 2.

Figure 4:
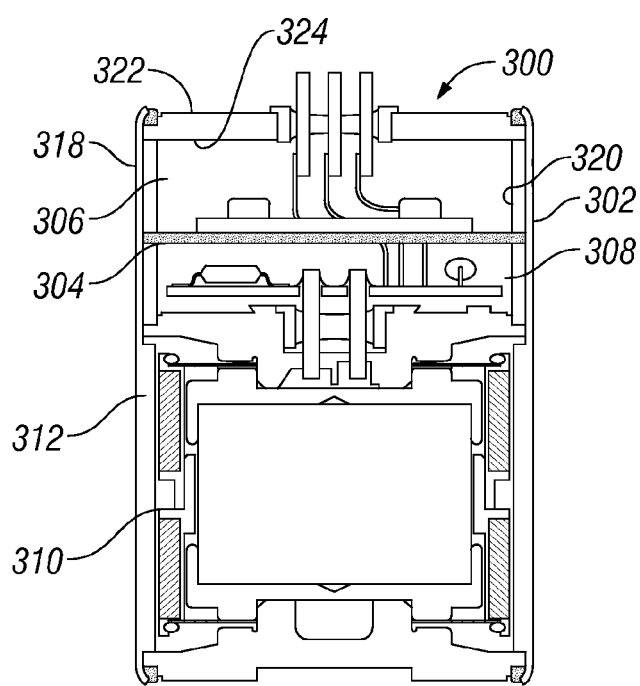
FIG. 4 illustrates multi-compartment aspects of the present disclosure with internal circuitry for providing a transducer output signal representative of sensed motion.

FIG. 4 illustrates a transducer 300 having multiple compartments within a transducer case 302. In one aspect, a dividing member 304 separates an upper compartment 306 from a lower compartment 308. A coil-magnet assembly 310 may be disposed immediately within a case wall 312. A coil-magnet cap 414 has an outer surface 316, a case extended wall portion 318 includes an inner surface 320, and a transducer end cap 322 has an inner surface 324. The surfaces 316, 320 and 324 define the main compartment, which is divided into the two compartments by the dividing member 304. Each compartment may include electronic circuits for modifying the coil-magnet assembly signal to provide a transducer output signal representative of motion.

Figure 5:
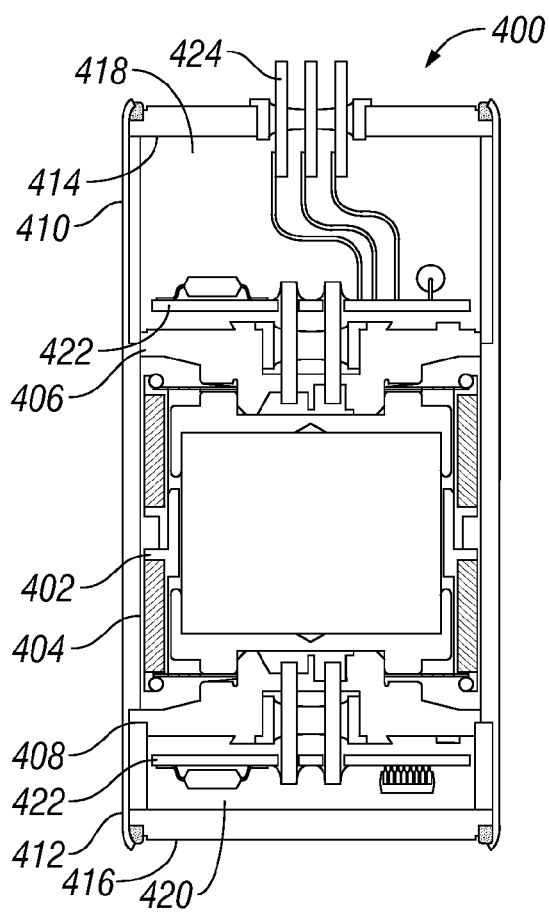
FIG. 5 illustrates another multi-compartment aspect of the present disclosure.

FIG. 5 illustrates another multi-compartment aspect of the present disclosure. In one non-limiting aspect, a transducer 400 includes a coil-magnet assembly 402 disposed immediately within a case 404. An inner top cap 406 is disposed within the case 404 and above the coil-magnet assembly 402. An inner bottom cap 408 is disposed within the case 404 and below the coil-magnet assembly 402. The case shown includes an upper extended wall section 410 and a lower extended wall section 412. The upper extended wall section extends beyond the inner top cap 406 and is closed at an upper end by a case cap 414. The lower extended wall section extends beyond the inner bottom cap 408 and is closed at a lower end by a second case cap 416.

In similar fashion to the transducer devices described above and shown in FIGS. 1-4, inner surfaces of the extended wall sections 410, 412, inner surfaces of the case caps 414, 416, and outer surfaces of the inner caps 406, 408 respectively define an upper compartment 418 and a lower compartment 420. Electronic circuits 422 may be placed in either or both compartments for modifying a signal from the coil-magnet assembly 402, and the modified signal may be transmitted from the transducer 400 using conductors 424 extending through one or both of the case caps 414, 416.

Figure 6:
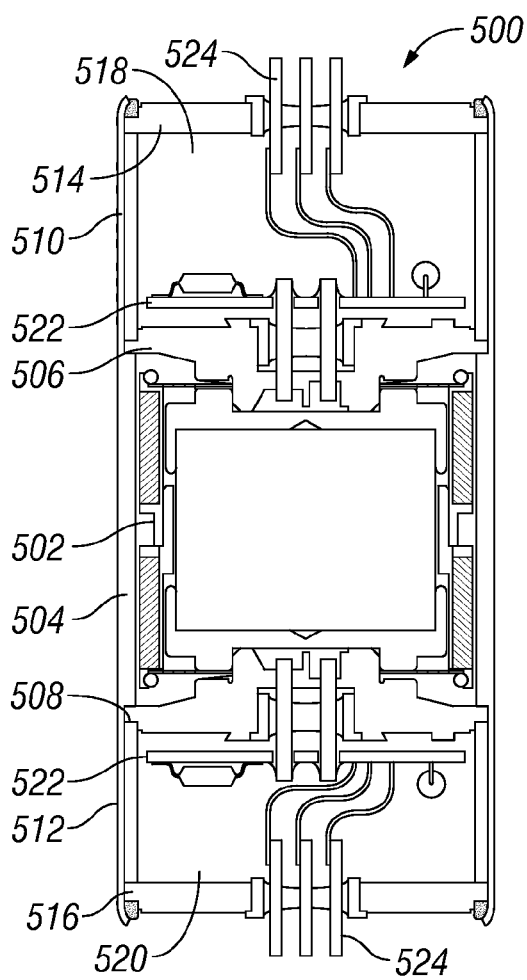
FIG. 6 illustrates yet another multi-compartment aspect of the present disclosure.

FIG. 6 illustrates yet another non-limiting example of multi-compartment aspect of the present disclosure. A transducer 500 includes a coil-magnet assembly 502 disposed immediately within a case 504. An inner top cap 506 is disposed within the case 504 and above the coil-magnet assembly 502. An inner bottom cap 508 is disposed within the case 504 and below the coil-magnet assembly 502. The case shown includes an upper extended wall section 510 and a lower extended wall section 512. The upper extended wall section extends beyond the inner top cap 506 and is closed at an upper end by a case cap 514. The lower extended wall section extends beyond the inner bottom cap 508 and is closed at a lower end by a second case cap 516.

In similar fashion to the transducer devices described above and shown in FIGS. 1-5, inner surfaces of the extended wall sections 510, 512, inner surfaces of the case caps 514, 516, and outer surfaces of the inner caps 506, 508 respectively define an upper compartment 518 and a lower compartment 520. Electronic circuits 522 may be placed in either or both compartments for modifying a signal from the coil-magnet assembly 502, and the modified signal may be transmitted from the transducer 500 using conductors 524 extending through each of the case caps 514, 516.

FIGS. 7-8 illustrate non-limiting examples of mounting and cable connector aspects of the disclosure. Referring to FIG. 7, a transducer 700 includes a coil-magnet assembly 702 disposed immediately within a case 704. An inner top cap 706 is disposed within the case 704 and above the coil-magnet assembly 702. The case shown includes an upper extended wall section 710. The upper extended wall section extends beyond the inner top cap 706 and is closed at an upper end by a case cap 714. The lower case end is closed a second case cap 716.

In similar fashion to the transducer devices described above and shown in FIGS. 1-4, an inner surface of the extended wall section 710, inner surface of the case cap 714, and the outer surface of the inner cap 706 respectively define an upper compartment 718. Electronic circuits 722 may be placed in the compartment 718 for modifying a signal from the coil-magnet assembly 702, and the modified signal may be transmitted from the transducer 700 using conductors 724 extending through case cap 714. A connector 708 may be used to connect a data cable (not separately shown) to the transducer 700. The connector may be any suitable connector useful in connecting a data cable. As a non-limiting example, the shown connector includes a threaded connection. Other non-limiting examples are bayonet connectors, banana plugs, soldered connection and other connectors. The connector 708 is shown with an angled housing 712. The housing may be angled or not depending on the particular application. Any suitable angle is within the scope of the disclosure.

The transducer shown also includes a threaded mounting stud 720 as a non-limiting example of how the transducer 700 may be mounted on to a structure or other media of interest where motion measurements are to be made. The mounting stud may also be set at a desired angle.

By way of non-limiting example, FIG. 8 represents a transducer 800 substantially similar to the transducer 700 shown in FIG. 7. The transducer 800 is shown without an angled threaded connector to illustrate the ability to configure the transducer 800 for a particular application. The transducer 800 includes conductors 824 connecting to terminal conductors 808 for connecting the transducer electronic circuits to external circuits not shown here. All other components of the transducer 800 are substantially similar to the like components described above and shown in FIG. 7. Therefore, further description is not necessary for the transducer example of FIG. 8.

Figure 9:
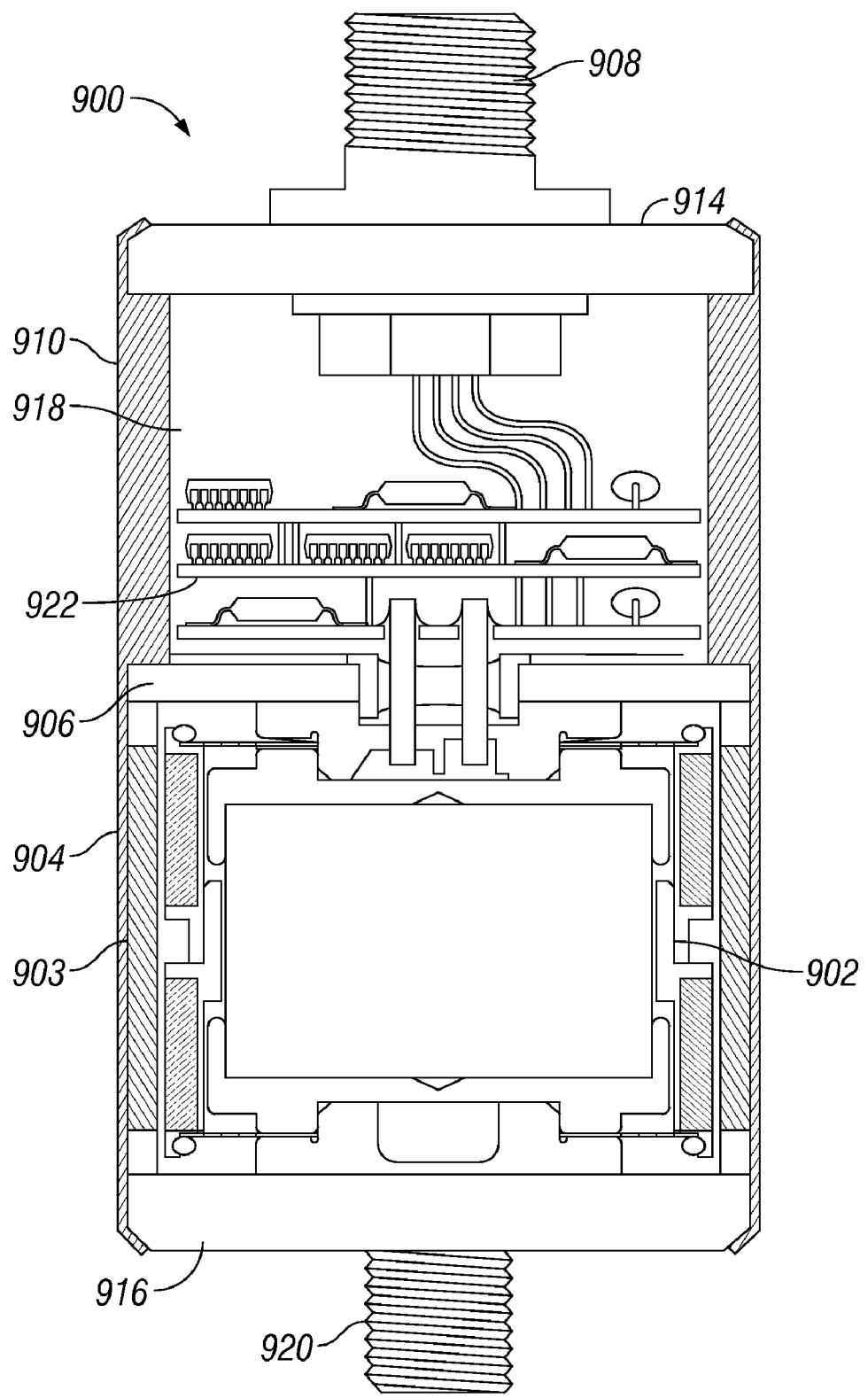
FIG. 9 illustrates an aspect of the disclosure wherein a coil-magnet assembly includes a sleeve pole concentrating piece.

FIG. 9 illustrates an aspect of the disclosure wherein a coil-magnet assembly includes a sleeve pole concentrating piece. Referring to FIG. 9, a transducer 900 includes a coil-magnet assembly 902 disposed immediately within a case 904. The coil-magnet assembly 902 may include a sleeve member 903 made of a material suitable for concentrating the magnetic flux generated by the coil-magnet assembly 902. In aspects, the sleeve material may be paramagnetic or ferromagnetic.

An inner top cap 906 is disposed within the case 904 and above the coil-magnet assembly 902. The case shown includes an upper extended wall section 910. In one non-limiting aspect, the extended wall section comprises a relatively thick wall as compared to the case wall disposed about the coil-magnet assembly 902. Reversing the relative thicknesses may affect the order of assembly, but the overall assembly and operation of the transducer is mostly unaffected by the choice regarding which wall section is thicker.

In the transducer shown, the upper extended wall section extends beyond the inner top cap 906 and is closed at an upper end by a case cap 914. The lower case end is closed a second case cap 916.

In similar fashion to the transducer devices described above and shown in FIGS. 1-4, an inner surface of the extended wall section 910, inner surface of the case cap 914, and the outer surface of the inner cap 906 respectively define an upper compartment 918. Electronic circuits 922 may be placed in the compartment 918 for modifying a signal from the coil-magnet assembly 902, and the modified signal may be transmitted from the transducer 900 via a connector 908. The connector may be any suitable connector useful in connecting a data cable. As a non-limiting example, the shown connector includes a threaded connection. Other non-limiting examples are bayonet connectors, banana plugs, soldered connection and other connectors. The connector 908 is shown with a straight housing. The housing may be angled or not depending on the particular application.

The transducer shown also includes a threaded mounting stud 920 as a non-limiting example of how the transducer 900 may be mounted on to a structure or other media of interest where motion measurements are to be made. The mounting stud may also be set at a desired angle.

Those skilled in the art would recognize that geophones need not be formed using a mass formed by a magnet coupled to the case while the coil form is moveable with respect to the case as described and shown here. Having the magnet being moveable with respect to the case and coil form would generally accomplish the same function.

The present disclosure is to be taken as illustrative rather than as limiting the scope or nature of the claims below. Numerous modifications and variations will become apparent to those skilled in the art after studying the disclosure, including use of equivalent functional and/or structural substitutes for elements described herein, use of equivalent functional couplings for couplings described herein, and/or use of equivalent functional actions for actions described herein. Such insubstantial variations are to be considered within the scope of the claims below.

Given the above disclosure of general concepts and specific embodiments, the scope of protection is defined by the claims appended hereto. The issued claims are not to be taken as limiting Applicant's right to claim disclosed, but not yet literally claimed subject matter by way of one or more further applications including those filed pursuant to the laws of the United States and/or international treaty.

What is claimed is:

1. A motion transducer apparatus, comprising:
   a case having an inner surface;
   a first cap that closes the case at a first end;
   a second cap that closes the case at a second end, the case inner surface, first cap and second cap defining a space within the case;
   at least one inner plate member separating the space into at a first compartment and a second compartment within the case;
   a coil-magnet assembly that produces a signal when subjected to motion, the coil-magnet assembly disposed immediately within the case and in the first compartment; and
   an electronic circuit disposed within the second compartment that modifies the signal.

2. An apparatus according to claim 1, wherein the electronic circuit comprises a circuit board.

3. An apparatus according to claim 2, wherein the circuit board comprises a plurality of circuit boards.

4. An apparatus according to claim 3, wherein the plurality of circuit boards are vertically arranged in a stacked relationship.

5. An apparatus according to claim 1, wherein the electronic circuit comprises one or more of i) an amplifier, ii) a signal conditioning circuit, iii) a force feedback circuit, and iv) an A/D converter circuit.

6. An apparatus according to claim 1 further comprising a dividing member disposed within the second compartment separating the second compartment to provide a third compartment.

7. An apparatus according to claim 6, wherein the electronic circuit comprises a first electronic circuit and a second electronic circuit, the first electronic circuit being disposed within the second compartment and the second electronic circuit being disposed within the third compartment.

8. An apparatus according to claim 1, wherein the at least one inner plate member comprises a first inner plate member and a second inner plate member, the first inner plate member and the second inner plate member being disposed on opposite ends of the coil-magnet assembly, the second inner plate member, case and second cap defining a third compartment within the case.

9. An apparatus according to claim 8 further comprising a second electronic circuit disposed in the third compartment.

10. An apparatus according to claim 1, wherein the case includes an extended wall section having a reduced thickness portion.

11. An apparatus according to claim 1, wherein the case includes an extended wall section having an increased thickness portion.

12. An apparatus according to claim 1, wherein the case includes an extended wall section, the apparatus further comprising a spacer disposed within the second compartment and adjacent the extended wall section.

13. An apparatus according to claim 1, wherein the coil-magnet assembly includes a member having a material for concentrating magnetic flux.

14. An apparatus according to claim 13, wherein the member comprises a sleeve disposed about a coil form.

15. An apparatus according to claim 13, wherein the material is selected from a paramagnetic material and a ferromagnetic material.

16. An apparatus according to claim 1, wherein the coil-magnet assembly includes a magnet coupled to the case and a coil moveable with respect to the case and the magnet.

17. An apparatus according to claim 1, wherein the coil-magnet assembly includes magnet and a coil, the magnet being moveable with respect to the case and the coil.

18. An apparatus according to claim 2, wherein the circuit board is vertically arranged.

19. A method for sensing motion, comprising:
   generating a signal representative of motion using a motion transducer, the motion transducer including a case having an inner surface, a first cap that closes the case at a first end, a second cap that closes the case at a second end, the case inner surface, first cap and second cap defining a space within the case, at least one inner plate member separating the space into at a first compartment and a second compartment within the case, a coil-magnet assembly that produces the signal when subjected to motion, the coil-magnet assembly disposed immediately within the case and in the first compartment; and
   modifying the signal using an electronic circuit disposed within the second compartment.

20. A method according to claim 19, wherein the electronic circuit comprises one or more of i) an amplifier, ii) a signal conditioning circuit, iii) a force feedback circuit, and iv) an A/D converter circuit.

21. A method according to claim 19, wherein generating the signal includes concentrating magnetic flux of the coil-magnet assembly using a member having material selected from a paramagnetic material and a ferromagnetic material.

* * * * *